(12) United States Patent
Gravot

(10) Patent No.: US 8,658,959 B2
(45) Date of Patent: Feb. 25, 2014

(54) PARALLEL ANALOG-TO-DIGITAL CONVERSION METHOD, DEVICE IMPLEMENTING SAID METHOD AND IMAGING DETECTOR COMPRISING SAID DEVICE

(75) Inventor: Vincent Gravot, Vourey (FR)

(73) Assignee: ULIS, Veurey Voroize (FR)

( * ) Notice: Subject to any disclaimer, the term of this patent is extended or adjusted under 35 U.S.C. 154(b) by 448 days.

(21) Appl. No.: 13/075,856

(22) Filed: Mar. 30, 2011

(65) Prior Publication Data

US 2011/0240833 A1    Oct. 6, 2011

(30) Foreign Application Priority Data

Mar. 31, 2010 (FR) ........................... 10 52433

(51) Int. Cl.
*G01J 1/44* (2006.01)
(52) U.S. Cl.
USPC ...................................... 250/214 DC
(58) Field of Classification Search
USPC ............. 250/214 DC, 208.1; 341/155–172
See application file for complete search history.

(56) References Cited

U.S. PATENT DOCUMENTS

| | | | | |
|---|---|---|---|---|
| 4,893,122 A | * | 1/1990 | Hoehn | 341/122 |
| 5,099,239 A | * | 3/1992 | Bruce et al. | 341/155 |
| 5,283,582 A | * | 2/1994 | Krenik | 341/158 |
| 7,164,379 B1 | * | 1/2007 | Rao | 341/161 |
| 7,336,214 B2 | * | 2/2008 | Krymski | 341/172 |
| 7,999,716 B2 | * | 8/2011 | Kurokawa | 341/157 |

OTHER PUBLICATIONS

Republique Francaise, Rapport De Recherche Preliminaire International Search Report, dated Nov. 18, 2010, 1 pg.
Multiple-Ramp Column-Parallel ADC Architectures for CMOS Image Sensors, Martijn F. Snoeij, et al., IEEE Journal of Solid-State Circuits, vol. 42, No. 13, Dec. 2007, 10 pgs.
Uncooled Amorphous Silicon Technology Enhancement for 25µm Pixel Pitch Achievement, E. Mottin, et al. SPIE vol. 4820 (2003), 8 pgs.

* cited by examiner

*Primary Examiner* — Seung C Sohn
(74) *Attorney, Agent, or Firm* — Harris Beach PLLC

(57) ABSTRACT

An ADC includes a single circuit for generating reference voltages that are constant and then decreasing over time. The ADC includes a constant current source and a resistive bridge connected to the current source. A voltage source produces a decreasing voltage on a node of the bridge. The ADC also includes a contact breaker for the connection of the voltage source to the node. The ADC also includes a digitization circuit which includes a means for comparing a voltage, a means for selecting a reference voltage, a means for counting, and a means for storing on the one hand, a reference associated with the constant reference voltage which is immediately lower than or equal to the voltage for conversion, and on the other hand, the number of counted time units.

11 Claims, 5 Drawing Sheets

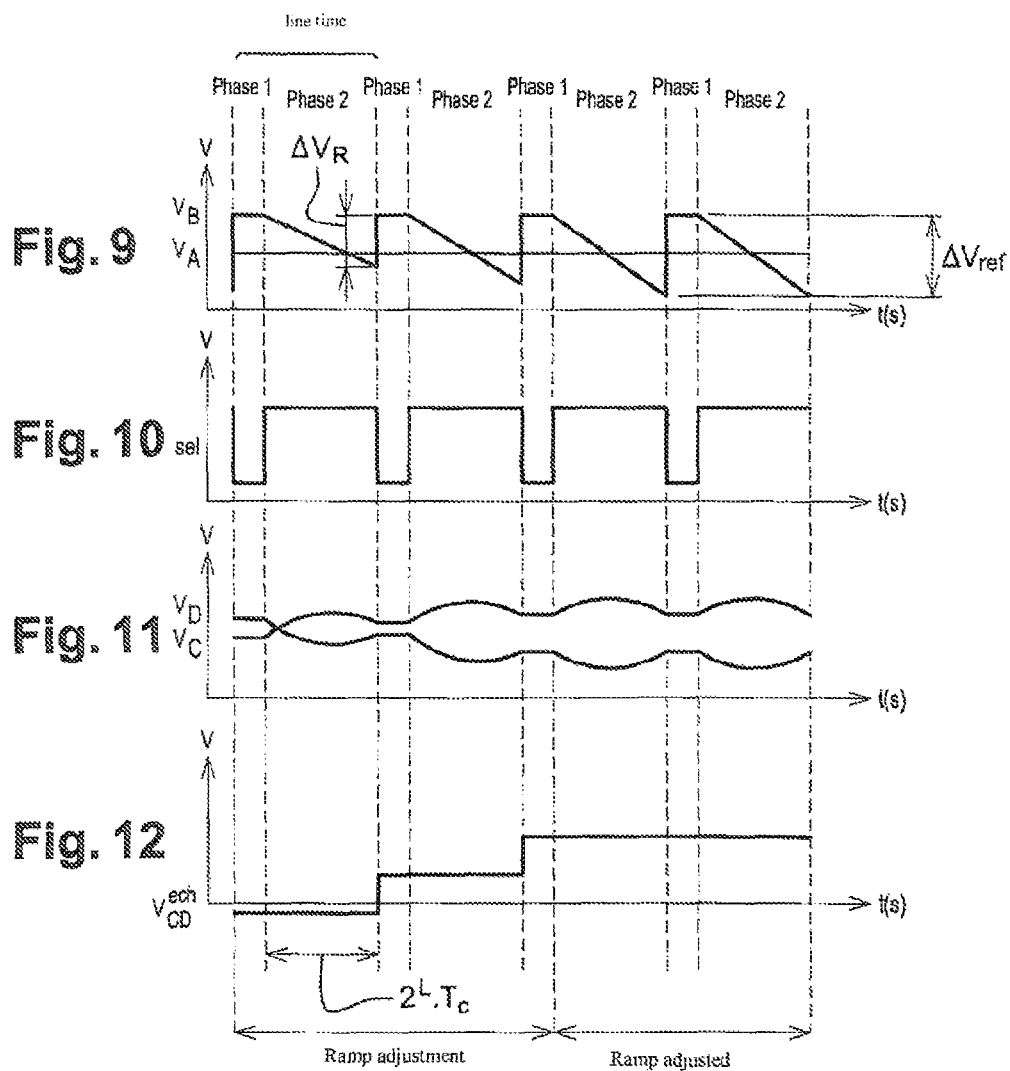
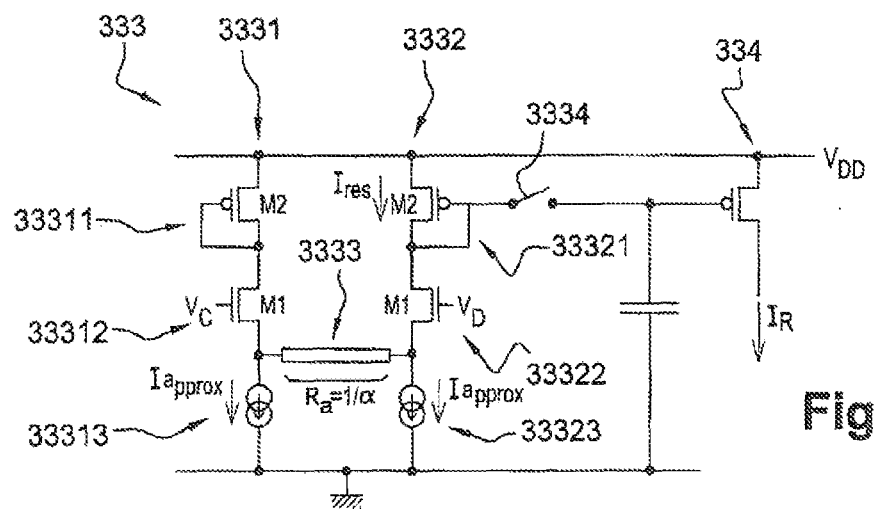

PARALLEL ANALOG-TO-DIGITAL CONVERSION METHOD, DEVICE IMPLEMENTING SAID METHOD AND IMAGING DETECTOR COMPRISING SAID DEVICE

CROSS REFERENCE TO RELATED APPLICATION

This application claims the benefit of French Patent Application No. 1052433, filed on Mar. 31, 2010. The entirety of this application is incorporated herein by reference.

BACKGROUND OF INVENTION

This invention relates to analog-to-digital conversion of a large number of simultaneously available analog signals, and in particular analog-to-digital conversion of signals from matrix detectors.

DESCRIPTION OF PRIOR ART

A matrix detector conventionally comprises a matrix of photo-detectors, read electronics forming analog signals, commonly voltages, in relation to the photo-detectors, and analog-to-digital conversion electronics converting the analog signals delivered by the read circuit into digital values.

For interface simplicity reasons, the matrix of photosensitive elements and the read and conversion electronics are generally produced as a single component.

There is a constant need to design high-speed conversion electronics that are low in energy consumption and small in surface area.

To reduce the surface area taken up by the conversion electronics, one technique comprises providing only one analog-to-digital conversion circuit (or "ADC" circuit) for the conversion of all the analog signals produced by the matrix of photo-detectors.

By providing just one ADC circuit, the number of electronic components is thus reduced, as is therefore the surface area taken up thereby. The ADC circuit must however convert all the signals produced by the matrix over the length of a frame and has therefore to be very high-speed. Yet the higher the speed of an ADC circuit, the more energy it consumes. Furthermore, the consumption of an ADC circuit is super-linear as its operating frequency comes close to its physical limitations. Moreover, just because of these physical operating limitations, there is currently no single series ADC circuit capable of digitizing a matrix detector in the VGA format beyond 30 Hertz.

To increase analog-to-digital conversion speed, and thereby reduce energy consumption by moving the operating frequency of the circuits away from their operating limit and/or to increase frame frequency, a technique is known of providing a plurality of ADC circuits for the detector. For example, there is a known technique of providing two ADC circuits associated with the odd and even lines, or a circuit associated with each quadrant of the matrix of photo-detectors, or again an ADC circuit associated with each column of the matrix of photo-detectors, or even one ADC circuit per photo-detector in the matrix.

However, although the energy consumption problem related to super-linearity is avoided, an ADC circuit consumes a not inconsiderable quantity of energy in linear conditions.

Indeed, the usual generic principle of converters, according to known techniques, comprises the analog modification in one or more phases of the signal for digitization itself.

A so-called "pipeline" ADC for example, usually implemented on the or each serial output of a matrix detector, operates using successive digitization stages on a limited number of bits, separated by the formation of intermediate residues intended for digitization by the next stage. Four 3 bit-stages each of decreasing significance represents a typical example of a 12-bit pipeline ADC. The formation of the residues typically requires the digital-to-analog re-conversion of the bits acquired, and then a subtraction of the result from the stage input signal, the residue then being offered to the following stage.

The extreme precision required by these repeated subtraction operations compels the use of very high gain amplifiers, i.e. with a plurality of stages and comprising a large number of transistors. The speed required for such converters means that the analog functions have to be performed under high currents, in super-linear conditions and therefore with very high energy consumption. A pipeline ADC proves very efficient, but limited by the required operating frequency and the associated super-linearity as soon as the format for conversion is sizeable.

Another type of ADC has been developed to circumvent this limitation, known as a "dual ramp ADC". The principle in this case is to form a first series of high-order bits by the high-speed discharge, along a first voltage ramp, of a capacitance whereof the charge represents the signal for digitization, counting the number of clock pulses, and then to form the low-order bits on the residue in the same way, but using a slower discharge until the initial charge is spent. These operations are performed using one or more analog circuits that modify the signal for digitization temporally in a controlled way (amplifier, integrator etc.) These converters are definitely faster, but here too, as with pipeline converters, these analog functions represent the bulk of the energy consumed.

On principle, according to these known techniques, a signal for digitization is therefore modified during the conversion process by the analog part of the converter, which is therefore mobilized until its task is completed. During the conversion of a plurality of analog signals, each signal mobilizes the analog part of the (or of one of the) converter(s). Put another way, there are as many analog processing operations to be performed as there are signals for digitization in order to constitute a frame. It follows that multiplying the digitizers in parallel architectures reduces the frequency and therefore the complications of super-linearity, but does not really resolve the energy consumption problem.

Furthermore, by multiplying the ADC circuits, the total surface thereof increases but so does the design complexity. Lastly, multiplying the ADC circuits induces a fixed pattern noise in the digital values as a result of the operating differences between them, which requires a subsequent digital processing operation in order to re-establish the quality of the images.

So, as can be seen, the speed, the low consumption and low surface area constitute conflicting characteristics in the analog-to-digital conversions of large quantities of data in the prior art. Commonly, the choice of analog-to-digital conversion used is made as a function of a compromise specific to the intended use.

SUMMARY OF THE INVENTION

The need is therefore easily understood for there to be an analog-to-digital conversion that is capable of processing a large number of analog signals in parallel, that is at once high-speed, with reduced energy consumption and surface area, and that has negligible fixed pattern conversion noise.

One of the objects of this invention is to propose a method and a device for analog-to-digital conversion that meets this need.

To this end, the object of the invention is an analog-to-digital conversion device capable of receiving voltages for conversion on parallel inputs with which it is provided, said device comprising:

a single circuit for the generation of voltages capable of generating reference voltages that are constant and then decreasing over time, according to discrete values, said voltage generation circuit including:

a current source capable of generating a first constant current;

a first resistive bridge formed of resistances in series and connected to the constant current source, the voltages at the nodes of the first resistive bridge forming the reference voltages;

a voltage source capable of producing a decreasing voltage on an injection node of the first resistive bridge;

a contact breaker for controlling the connection of the voltage source to the injection node of the first resistive bridge, and a digitization circuit connected to each parallel input of the device, said circuit being connected to the reference voltage generation circuit including:

means for comparing the voltage for conversion received on one of the parallel inputs of the device with the reference voltages generated by the voltage generation circuit;

means for selecting the reference voltage whereof the value, when said reference voltage is constant, is immediately higher than the voltage for conversion;

means for counting a number of time units necessary for the reference voltage selected to become lower than the voltage for conversion when said reference voltage is in the decrease phase; and means for storing, on the one hand a reference associated with the constant reference voltage which is immediately lower than or equal to the voltage for conversion and, on the other hand, the number of counted time units, the high-order bits of the digital value of the voltage for conversion corresponding to said reference, and the low-order bits of said digital value corresponding to the number of counted time units.

Put another way, the analog functions, and in particular the generation of reference voltages, are implemented by a single analog circuit. This advantageous feature exploits the fact that the converter according to the invention does not modify the signal for digitization, which is thus preserved intact during the digitization process. There is therefore no further need to perform as many analog processing operations as there are signals for digitization in order to form a frame. In other words, the analog functions can be mutualized.

Since these analog functions are the main sources of energy consumption and require components that take up a large surface area, the use of a single analog circuit for the conversion of a plurality of voltages therefore allows energy savings and a reduction in the total surface area taken up by the device.

Furthermore, the digitization circuits associated with the voltages for conversion are of straightforward design and their functions (comparisons, counting, selection, storage in particular) can be implemented by straightforward digital components, such as comparators, counters and memories for example. These digital components do not consume a great deal of energy, and, to advantage, only consume energy during switching operations, i.e. over short periods of time.

It will further be noted in this respect that it is not necessary to amplify a voltage for conversion, unlike some prior art ADC circuits, which compare the output of the components of an amplifying chain receiving the voltage with a single reference voltage. The voltages for conversion therefore remain unchanged throughout the digitization cycle.

Furthermore, the digitization circuits employ a smaller number of digital components so that each of these circuits takes up a smaller surface area. It is thus possible to use the conversion device according to the invention in a matrix detector for a parallel conversion of the voltages produced by the matrix of photo-detectors, without however having to make provision for a large surface to this end. For example, a digitization circuit may be implemented at the foot of each column of the matrix of photo-detectors. The frame frequency may therefore be increased and/or the super-linear consumption conditions avoided.

It should also be noted that the main source of dispersion of characteristics in the prior art has disappeared. In the prior art, a fixed pattern digitization noise does in fact appear when a plurality of independent ADC circuits are used due to the dispersion of the operating characteristics thereof. In fact, the main cause of these dispersions is analog in nature, since the digital components have for their part a contained dispersion of their characteristics. By providing only one analog circuit, the main causes of the fixed pattern digitization noise are therefore absent. Thus, as will become clear from reading the description of embodiments of the invention, basically only the spatial differences between comparator circuits remain as they were.

Next, apart from the speed of conversion induced by the parallel processing of the voltages for conversion, the device of the invention implements a digitization by sequential comparison with a discrete set of constant reference voltages in order to determine the high-order bits followed by a comparison with a continuous decreasing voltage in order to determine the low-order bits.

Lastly, the resistive bridge offers in particular the advantage of providing straightforwardly and without excessive energy consumption a means of producing simultaneously a plurality of reference voltages. The formation of the voltage references from a resistive bridge is precise since it is easy to obtain a series of very linear and essentially identical resistances. The voltage source makes it possible for its part, when it is connected to a node of the resistive bridge, to produce an identical decrease in respect of all the reference voltages.

According to one embodiment of the invention, the reference voltage generation circuit is configured to deliver reference voltages, whereof the values are evenly spaced apart by a predetermined pitch, that are constant over time or decreasing along a single predetermined voltage ramp. According to one advantageous embodiment of the invention, the generation circuit is configured to deliver $2^H$ reference voltages evenly spaced apart by a predetermined pitch and to decrease these by the predetermined pitch over a period of time equal to $2^L \cdot T_C$, where H is the number of high-order bits, L is the number of low-order bits and $T_C$ is the value of the time unit.

The digitization is thus realized along two ramps, the first ramp being discrete and defined by the sequential selection of the constant reference voltages, and the second ramp being continuous and defined by the predetermined voltage ramp. The first ramp has to advantage a much steeper slope than the slope of the second ramp, so that a high-speed analog-to-digital conversion is obtained.

To advantage, the second decreasing voltage source comprises:
- a voltage circuit configured to produce a voltage substantially identical to that of the injection node of the first bridge in the absence of a connection between the decreasing voltage source and the reference node of the first resistive bridge;
- a current generating circuit;
- an operational amplifier, mounted in inverse feedback on its inverting input via a capacitor, whereof the inverting input is connected to the voltage circuit, and whereof the output is connected to the injection node of the first resistive bridge.

The controllable contact breaker is furthermore mounted in inverse feedback on the inverting input of the operational amplifier.

Thus, when the contact breaker is closed, the operational amplifier works as a follower so that it does not vary the voltage on the injection node. The reference voltages therefore remain constant. On the other hand, when the contact breaker is open, the current produced by the current generator is integrated by the amplifier mounted in inverse feedback, thereby decreasing the output voltage of the amplifier and therefore the voltage at the injection node according to the value of the integrated current and the capacitance of the capacitor.

In particular, the current generator may comprise:
- a detection circuit capable of measuring the difference between the voltage of a node of the first resistive bridge and an expected value for this voltage at mid-slope, and of producing a current in proportion to said difference;
- a capacitor connected to the detection circuit and capable of integrating the current delivered thereby; and
- a current source forming the current delivered by the current generator as a function of the voltage at the terminals of the capacitor.

In this way, the current produced by the generator automatically adjusts the slope of the ramp to the value required for it. Great accuracy is therefore obtained, and constantly preserved, and is so even in the presence of significant variations in the characteristics of the analog components, such as for example variations caused by a change in temperature.

According to one embodiment of the invention, the digitization circuit may further comprise a sequential selection circuit connected to the reference voltage generation circuit so as to receive the reference voltages therefrom on parallel inputs, said selection circuit being capable of sequentially selecting the reference voltages according to their decreasing values and of delivering the selected voltages to the comparison means. In particular, the comparison means include a comparator connected to the parallel input of the device and to the output of the sequential selection circuit, and wherein the storage means include a memory controlled by the comparator output and storing the address of the parallel input of the sequential selection circuit in process of selection when the comparator output flips.

The high-order bits are thus determined directly by the address of the selected input of the selection circuit, with no additional processing.

According to a first alternative:
- the reference voltage generation circuit is capable of generating an additional voltage higher than the reference voltages, and comprises a controllable switch capable of selecting and delivering to the sequential selection circuit, the lowest voltages of the set formed by the reference voltages and the additional voltage or the highest voltages of said set;
- control means capable of flipping the switch into its highest voltage selection mode when the comparator flips; and
- means of blocking the sequential selection circuit on the input whereof the voltage flips the comparator.

According to a second alternative, the means of selecting the reference voltage immediately higher than the voltage for conversion include means for blocking the sequential selection circuit on the input corresponding to the voltage immediately higher than the one that flips the comparator.

A further object of the invention is an electromagnetic radiation matrix detector including:
- a matrix of photo-detectors, each of the photo-detectors being capable of varying an electric variable as a function of the radiation incident thereon;
- electronics capable of addressing said matrix line by line, of forming electric voltages relative to the photo-sensitive elements of the addressed line, and of delivering said voltages to parallel outputs; and
- an analog-to-digital conversion device capable of digitizing the electric voltages delivered to the parallel outputs of the read circuit, According to the invention, the analog-to-digital conversion device is of the aforementioned type, a digitizer circuit being connected to each output of the read electronics.

A further object of the invention is a method for the digital conversion of a plurality of voltages, comprising:
- a first phase comprising:
    - generating a single set of reference voltages that are constant over time and codified in particular by a serial number or an address; and
    - for each voltage for conversion, comparing same with the constant reference voltages, and storing the identifying code of the constant reference voltage that is immediately below it, said reference constituting the high-order bits of the digital value of the voltage for conversion, According to one embodiment of the invention, the values of the constant reference voltages are discrete and evenly spaced apart by a predetermined pitch, and the decreasing reference voltages are decreasing along a single predetermined ramp. In particular, the decreasing reference voltages decrease by the predetermined pitch over a period of time equal to $2^L \cdot T_C$, where L is the number of low-order bits and $T_C$ is the value of the time unit.

BRIEF DESCRIPTION OF THE DRAWINGS

The invention will be better understood from reading the following description, provided solely by way of example, and given in relation to the appended drawings, wherein identical reference numbers denote identical or similar elements, and wherein:

FIGS. 9 to 12 are flow charts of characteristic voltages during the ramp slope control phase; and FIG. 13 is a diagrammatic view of a current converter forming a constituent part of the loop in FIG. 4.

DETAILED DESCRIPTION OF THE INVENTION

Figure 1:
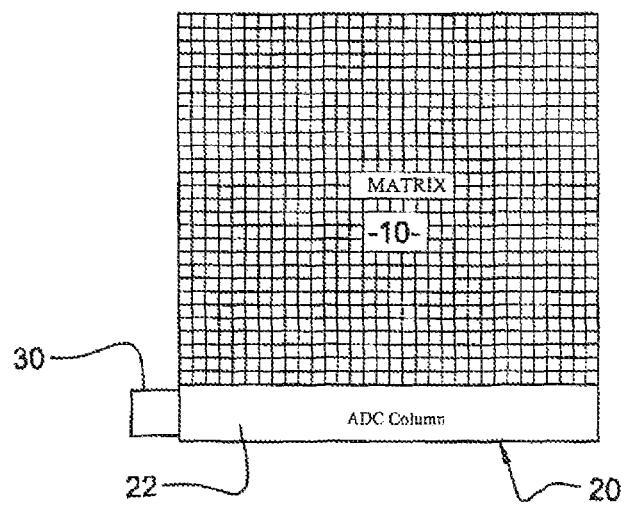
FIGS. 1 and 2 are diagrammatic views of an analog-to-digital conversion device in accordance with the invention and used to digitize by columns the signals from a matrix detector.
Figure 2:
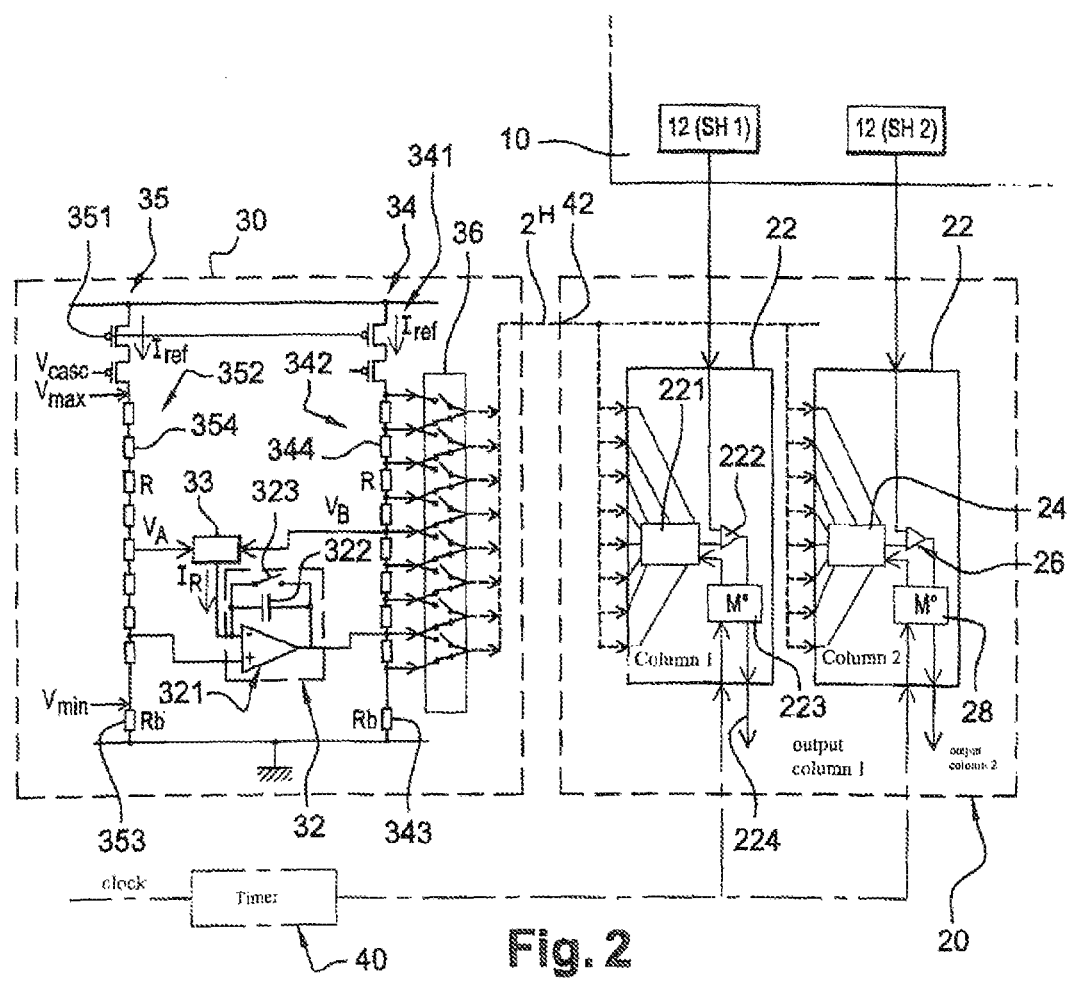

In FIGS. 1 and 2 has been shown an imaging matrix 10 of a detector, formed by a matrix of photo-detectors and electronics capable of addressing said matrix line by line, of forming electric voltages relative to the photosensitive elements of the addressed line, and of delivering said voltages to parallel outputs by means of sample/holds 12 that retain the voltage for the time needed to digitize them. This type of matrix detector with a so-called "scanned" read mode is conventional and will not therefore be described in further detail subsequently. It is for example a bolometric detector comprising a matrix of bolometric micro-bridges suspended above a substrate and read, clocking and addressing circuitry, as described in the document "*Uncooled amorphous silicon enhancement for 25 µm pixel pitch achievement*" by E. Mottin et al., Infrared Technology and Application XXVIII, SPIE, vol. 4820. It will merely be noted here that the imaging matrix 10 simultaneously supplies a large number of voltages for digitization, namely in the example shown the voltages produced by the photo-detectors of a single addressed line, and thereafter line by line.

According to the invention, to perform an analog-to-digital conversion of the voltages simultaneously obtained for each line of the imaging matrix 10 and held in the sample/holds 12, an analog-to-digital conversion device includes:

a digitization line 20, formed of digitization circuits 22 respectively associated with the columns of the matrix 10 and respectively connected to the sample/holds 12; and a single circuit 30 for the generation of reference voltages, known as a "reference generator", placed for example at the end of the digitization line 20, and connected to each of the digitization circuits 22.

The digitization circuits 22 and the generator 30 preferably form an integral part of the read electronics of the imaging matrix 10 (an integral part for example of the read circuit formed in the substrate of a bolometric detector with microbridges) and are synchronized with the formation of the analog signals from the sample/holds 12 by means of a common sequencer (not shown).

Likewise, the digital outputs of the digitization circuits 22 are synchronized at output via a serial multiplexer (not shown) in order to deliver said values to a communication interface with the matrix 10, in a way known per se in the prior art.

The reference generator 30 includes:

two circuits forming identical bridges 34 and 35, each including a current source 341, 351 delivering a constant current $I_{ref}$ and a resistive bridge 342, 352, connected between the current source 341, 351 and a grounded additional resistance 343, 353 of value $R_b$. Each of the resistive bridges 342, 352 is formed of a series of $2^H$ resistances 344, 354 substantially identical and of value R, wherein flows the constant current $I_{ref}$ and at the nodes of which are defined the voltages $V_{ref}^1$, $V_{ref}^2$, $V_{ref}^3$, ..., $V_{ref}^i$, ..., $V_{ref}^{2^H}$, $V_{ref}^{2^H+1}$. The current sources 341, 351 are to advantage in the form of cascoded transistors mounted as a current mirror so that the currents flowing in the two resistive bridges 342, 352 can be clearly identified;

an integrator 32 including an operational amplifier 321 mounted in inverse feedback on its inverting "−" input via a capacitor 322 of capacitance C and via a controllable contact breaker 323 in parallel with the capacitance 322. The non-inverting "+" input and the output of the amplifier 321 are furthermore connected respectively to corresponding nodes of the resistive bridges 342, 352, other than the end nodes of the resistive bridges 342, 352. In the example shown, these nodes are the second nodes of the resistive bridges 342, 352 starting from the ground. The node of the resistive bridge 342 to which the output of the operational amplifier 321 is connected will hereinafter be denoted by the term "injection node";

a current generating circuit 33, capable of injecting a constant current $I_R$, known as "ramp current", at the inverting input "−" of the amplifier 321, as will be explained in further detail subsequently; and a controllable switch 36, connected at input to the $2^H+1$ nodes defined by the $2^H$ resistances 344 of the resistive bridge 342 and connected at output to a parallel bus 42 with $2^H$ tracks. The switch 36 selects on command either the $2^H$ voltages of the $2^H$ first nodes starting from the ground, and therefore the $2^H$ lowest voltages among the $2^H+1$ voltages defined on the nodes, or the $2^H$ voltages of the $2^H$ last nodes starting from the ground, and therefore the $2^H$ highest voltages among the $2^H+1$ voltages defined on the nodes. The voltages selected are thus transmitted simultaneously on the parallel bus 42.

Each of the digitization circuits 22 further includes:

a controllable sequential selection circuit 221, connected to the bus 42 in order to receive the $2^H$ voltages selected by the switch 36. The function of the circuit 221 is to select these voltages one after another in descending order thereof. Since the voltages received are by construction arranged in order, the circuit 221 connects its output to its inputs sequentially to this end;

a comparator 222, connected to the output of the selection circuit 221 and to the output of the corresponding sample/hold 12. The comparator 222 is in a low state when the output signal of the sample unit 12 is smaller than the output from the selection circuit 221, and in a high state otherwise; and a digital memory 223, connected to the selection circuit 221 and to the comparator 222. The memory 223 is configured to store the address of the input selected by the selection circuit 221 when the comparator 222 flips into its high state, and to deliver to the selection circuit 221 a blocking signal thereof on the input whereof the address is stored at the time of said flipping. The memory 223 is furthermore connected to a column bus 224, for example for its connection to a multiplexer, as is known per se.

Lastly, the analog-to-digital conversion device of the invention comprises a timer 40 receiving a clock signal from a clock (not shown), for example the one already provided for the clocking and addressing of the lines of the imaging matrix 10. The timer 40 counts the number of time units of predetermined value $T_C$ that have elapsed since its re-initialization and delivers the counted number to each of the memories 223 of the digitization circuits 22, as will be explained in further detail subsequently.

Since the non-inverting input "+" and the output of the amplifier 321 are connected to the same potential because of the identity of the circuits forming the bridges 34, 35, the amplifier 321 therefore works as a follower and thus exerts substantially no influence over the resistive bridge 342 when the contact breaker 323 is on. The voltages at the nodes of the resistive bridge 342 therefore remain constant.

Since furthermore the resistances 344 of this bridge are substantially identical and of value R, the voltages at said nodes are therefore evenly spaced apart by an increment of voltage equal to $\Delta V_{ref} = R \cdot I_{ref}$.

The voltages $V_{ref}^1, V_{ref}^2, V_{ref}^3, \ldots, V_{ref}^i, \ldots, V_{ref}^{2^H}, V_{ref}^{2^H+1}$ so defined at the nodes of the resistive bridge 342 are therefore equal to:

$$V_{ref}^1 = V_{min} = R_b \cdot I_{ref}$$

$$V_{ref}^2 = V_{min} + \Delta V_{ref}$$

$$V_{ref}^3 = V_{min} + 2 \cdot \Delta V_{ref}$$

$$\ldots$$

$$V_{ref}^i = V_{min} + (i-1) \cdot \Delta V_{ref}$$

$$\ldots$$

$$V_{ref}^{2^H} = V_{min} + (2^H - 1) \cdot \Delta V_{ref}$$

$$V_{ref}^{2^H+1} = V_{min} + (2^H) \cdot \Delta V_{ref} = V_{max}$$

The dynamics of the voltage converter is defined by $V_{ref}^{2^H+1} - V_{ref}^1$, i.e. a voltage amplitude equal to $2^H \cdot \Delta V_{ref}$.

When the contact breaker 323 is open, the integrator 32 integrates the current $I_R$ from the generator 33 and delivers a decreasing voltage to the injection node of the resistive bridge 342 of constant slope equal to $$-\frac{I_R}{C}.$$

Since the current $I_{ref}$ is kept identical in all the resistances of the resistive bridge 342, the voltages $V_{ref}^1, V_{ref}^2, V_{ref}^3, \ldots, V_{ref}^i, \ldots, V_{ref}^{2^H}, V_{ref}^{2^H+1}$ at the nodes of the bridge 342 therefore decrease from the constant values defined above with a constant slope $$-\frac{I_R}{C}.$$

Thus for example, the $i^{th}$ voltage is equal to $$V_{ref}^i(t) = V_{min} + (i-1) \cdot \Delta V_{ref} - \frac{I_R}{C} \cdot t,$$

where t is the time that has elapsed since the contact breaker 321 was opened.

A description will now be given, in relation to FIGS. 3 and 4, of the method for the digitization of output voltages of the sample units 12 implemented by the analog-to-digital conversion device that has just been described.

Figure 3:
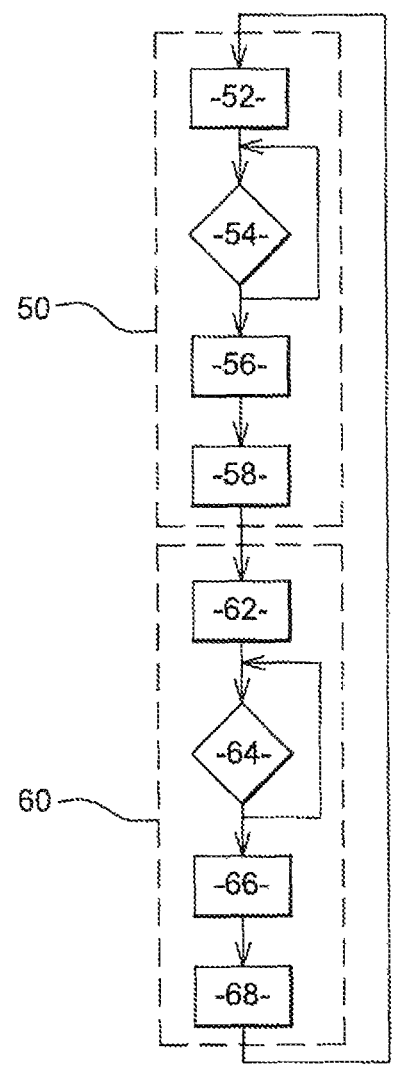
FIG. 3 shows a flow chart of the operations performed according to the digitization method forming the subject matter of the invention.

FIG. 3 is a flow chart of said method. FIG. 4 shows for its part the change over time in the output voltages of the switch 36, in the output voltage of a selection circuit 221 of a particular digitization circuit 22, and a voltage for conversion by this particular digitization circuit 22.

The method comprises two successive phases, namely a first phase 50 for the determination of the high-order bits of the digital values of the voltages for digitization, followed by a second phase 60 for the determination of the low-order bits of said digital values.

According to the invention, the digitization is performed on H high-order bits and L low-order bits.

The number of resistances 344 of the resistive bridge 352 is selected to be equal to a power of two, namely $2^H$. The current $I_R$ is for its part selected so that each of the voltages of the resistive bridge 342 decreases by the voltage increment $\Delta V_{ref}$ over a predetermined period of time equal to $\Delta T_L = 2^L \cdot T_C$. A continuous voltage ramp is thus obtained with a slope of theoretical value $$\frac{\Delta V ref}{2^L \cdot T_c}$$

for the voltages of the resistive bridge 342.

To advantage, the integer H is selected to be equal to 3 and the integer L equal to 10, which means that the voltages delivered by an imaging matrix can be digitized on 13 bit effective resolution, a sharpness that is satisfactory in most relevant scenarios. The preferential choice of 3 high-order bits makes it possible on the one hand to limit the conversion time $2^L \cdot T_c$ necessary to the second ramp, which represents the bulk of the total conversion time, and to limit on the other hand the number of critical points constituted by moving from one high-order interval to the next. Indeed, although the proposed conversion circuit is designed to meet the need, a very slight slope error may produce an error on the last bit, and it is therefore appropriate to limit the frequency of occurrence of these sensitive conversions, a frequency proportionate to $2^H$.

The phase 50 for the determination of the high-order bits starts with re-initializing the memories 223 of the digitization circuits 22, the effect of which is to re-initialize the selection circuits 221, and closing the contact breaker 321 of the reference generator 30. Since the contact breaker 321 is closed, the operational amplifier therefore works as a follower so that the voltages at the nodes of the resistive bridge 342 are constant.

During the initialization step 52, the switch 36 is also controlled in order to select the $2^H$ lowest voltages of the nodes of the bridge 342. These voltages then constitute constant reference voltages, evenly spaced apart by $\Delta V_{ref}$ between the voltages $V_{min}$ and $V_{max}$, used for the determination of the H high-order bits of the digital values of the voltages for conversion.

The phase 50 then continues, in each digitization circuit 22, with the sequential selection, at 54, of the inputs of the selection circuit 221 and the delivery of the selected input to the comparator 222. The sequential selection continues so long as the selected input is higher than the voltage for conversion received by the comparator 222 from the corresponding sample/hold 12.

Figure 4:
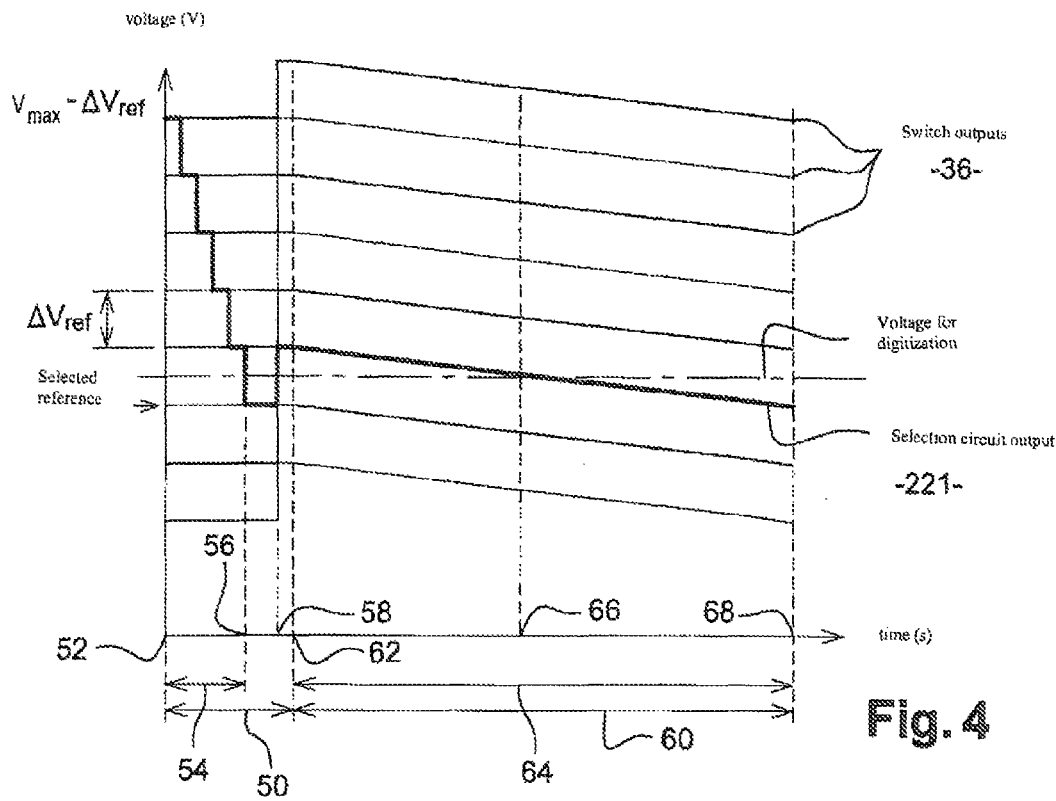
FIG. 4 shows an example of the layout of the voltage delivered to a comparator input from a digitizer circuit of the device in FIG. 1.

This sequential selection is shown in FIG. 4 wherein the output voltage of the selection circuit 221 initially takes the form of a discrete ramp decreasing in steps, said ramp starting at the voltage $V_{max}$ and having steps evenly spaced apart by the increment $\Delta V_{ref}$.

As soon as the output voltage of the selection circuit 221 is lower than the voltage for conversion, the comparator 222 flips, at 56, into its high state. The memory 223 then stores in its memory the address, i.e. the codification, of the selected input of the selection circuit 221 and sends thereto a blocking signal. The circuit 221 then remains blocked on the address input stored in the memory 223. This address thus constitutes the value of the H high-order bits, increased by one unit, of the digital value of the voltage for conversion.

Once the high-order bits are determined (with surplus of one unit) for all the voltages for conversion stored in the sample/holds 12, the method then continues with the actuation, at 58, of the switch 36 so that it selects the $2^H$ highest voltages at the nodes of the resistive bridge 342. As the resistances of the resistive bridge 342 are identical, the effect of this is to increment the input constant voltages of the selection circuits 221 by the value $\Delta V_{ref}$ as is shown in FIG. 4.

Thus, before the switch 36 is flipped, the voltage selected by a selection circuit 221 is the reference voltage immediately lower than the corresponding voltage for conversion and after the switch 36 is flipped, the voltage selected by the circuit 221 is the reference voltage immediately higher.

This shift by the increment $\Delta V_{ref}$ makes it possible in particular to avoid the so-called "Schmidt trigger" effect of the comparators 222. Indeed, as will be explained hereinafter, the purpose of the second phase 60 of the method is to determine the value of the L low-order bits, using a second comparison implemented by the comparators 222. It is advantageous, in terms of the precision of the flip point thereof, for the second comparison to be made by approaching the flip threshold on the same side as during the first comparison of the first phase 50. Following the increment of the voltages received by the selection circuits 221, the output voltage of each selection circuit 221 is again higher than the corresponding voltage for conversion. Thus, the comparators 222 all flip into their low state and are therefore again ready to change state with the same direction of flip at a crossover of their inputs.

As an alternative, the switch 36 is omitted and the $2^H$ voltages at the nodes of the resistances 344 are supplied directly to the selection circuits 221. In this alternative, each memory 223 includes a first zone allocated to the storage of the address of the input of the corresponding selection circuit 221 when the associated comparator 222 flips, and a second zone allocated to the storage of the address on which the selection circuit 221 is blocked during the second phase 60. When the comparator 222 flips, the address selected is then copied in both zones of the memory 223. Once the first phase 50 is completed, the address stored in the first zone of each memory 223 is decremented by one unit (and thus forms the pure H high-order bits). A selection circuit 221 therefore selects the reference voltage that is immediately higher than the corresponding voltage for conversion.

This alternative has the advantage of ensuring temporal continuity of the voltages carried in the bus 42 between the phases 50 and 60, and maintaining immunity relative to the "Schmidt trigger" effect and also allows the switch 36 to be eliminated.

The second phase 60 for the determination of the low-order bits then starts after a predetermined period of time after the switch 36 is flipped, with the opening, at 62, of the contact breaker 323 of the reference generator 30. Simultaneously, the timer 40 is re-initialized.

Closure of the contact breaker 323 thus initiates, in each digitization circuit 22, a step for the decrease 64 of the output voltage of the selection circuit 221 along a continuous ramp of constant slope of theoretical value $$\frac{\Delta V_{ref}}{2^L \cdot T_c},$$

as shown in FIG. 4.

As soon as this voltage is lower than the corresponding voltage for conversion, the comparator 222 then flips into its high state at 66. At this instant, the memory 223 then stores the value of the timer 40, this value thus constituting the value of the L low-order bits of the digital value of the voltage for conversion.

The second phase 60 then terminates once the period of time $2^L \cdot T_C$ has elapsed since the contact breaker 323 was closed, thereby ensuring that all the low-order bits of the voltages for conversion have been properly determined. The content of the memories 223 is then, at 68, read and delivered to a communication interface by means of a serial multiplexer. The 3 high-order bits pass through a digital subtractor (not shown, placed for example after the serial multiplexer, or even downstream from the read circuit) in order to decrement them all by one unit. Indeed, the comparator 222 has inverted its output during the formation of the high-order bits while the address of the reference voltage selected at input had progressed by one surplus unit. It will be noted that in the alternative proposed where the switch 36 is omitted, this subtraction is already implemented between the phases 50 and 60, the high-order bits are then directly contained in the first zone of the memories 223.

The second phase 60 then loops to the first phase 50 for a new cycle of conversion of new voltages delivered by the sample/holds 12.

It should be appreciated that the digitization obtained according to the proposed description, in respect of which the code of the fixed references is incremented starting from the highest during the first phase, and the timer is incremented during the second phase, is staged between Vmax and Vmin according to an increasing digital count, corresponding to a decreasing analog value. The value "00 - - - 00" thus corresponds to the highest analog input voltage $V_{max}$, and the value "11 - - - 11" corresponds to the lowest analog input voltage $V_{min}$. This complementation of the values has no importance in the field however, since the user knows full well what he is handling. A result directly in accordance with the input magnitude would be obtained by an increasing selection during the first phase, and ascending ramps during the second phase, while remaining true to the spirit of the invention, without it being necessary to go into further detail.

Furthermore, the address of the references will be coded to advantage by the selector 221 by what is known to those skilled in the art as a "Grey code" rather than by digital addresses ordered according to a standard binary increase. This code is characterized by the variation of a single address bit when moving from any one reference to an adjacent reference, thereby avoiding the possibility of any spurious flipping of the comparator 222 during the discrete scanning of the first digitization phase, according to a technique well known to those skilled in the art.

Furthermore, the identity of the bridges 34 and 35 is established for reasons of clarity thus far in the disclosure, but it will be easily understood that it is advantageous to produce solely the identity of the voltages appearing at the equivalent nodes of said bridges. Indeed, it is very straightforward to produce resistances 354 and Rb X times higher in order to form the resistive bridge 352 relative to the resistances 344 and Rb' forming the resistive bridge 342, which delivers practically no current at its nodes, so as to divide its consumption by the same ratio X. The feed transistors 341 will be also duplicated X times in parallel relative to the architecture of the bridge 35 so as to ensure identity of behavior of the potential nodes despite the current ratio X between the two bridges. The overall consumption of the analog circuit 30 is thus minimized to what is strictly necessary.

The digital conversion according to the invention may derive a lack of precision from the unit comprising the voltage generation circuit 33 and the integrator 32 responsible for generating the voltage ramp.

Indeed, even if the current generator circuit 33 delivers a current strictly equal to $$\frac{C \cdot \Delta Vref}{2^L \cdot T_c},$$

at a given instant and in given operating conditions, i.e. one that produces the required theoretical value $$\frac{\Delta Vref}{2^L \cdot T_c}$$

for the slope of the voltage ramp, it is not certain that a ramp will be obtained that causes a decrease by the increment ΔVref over the period of time $2^L \cdot T_C$ at another instant or when the operating conditions change. For example, the theoretical value of the slope presupposes the use of a perfect operational amplifier 321, and a value C of the capacitance 322 that is exactly calibrated and constant. Indeed, apart from this capacitance, all the components, whether they are analog or digital, present with variable behavior as a function in particular of their level of wear and their temperature, thereby deviating the ramp slope from the value theoretically obtained using a current $I_R$ of value $$\frac{C \cdot \Delta Vref}{2^L \cdot T_c}.$$

Likewise, a deviation appears relative to the ideal ramp value if the current $I_R$ deviates from the theoretical value $$\frac{C \cdot \Delta Vref}{2^L \cdot T_c},$$

due for example to an operating drift from a constant current source used to generate the current $I_R$.

To advantage, the generator circuit 33 is configured to determine a current $I_R$ as a function of the real decrease in a voltage of a node of the resistive bridge 342, i.e. as a function of the real slope of the voltage ramp.

A description will now be given, in relation to FIGS. 5 to 12, of a preferred embodiment of the current generator circuit 33.

Figure 5:
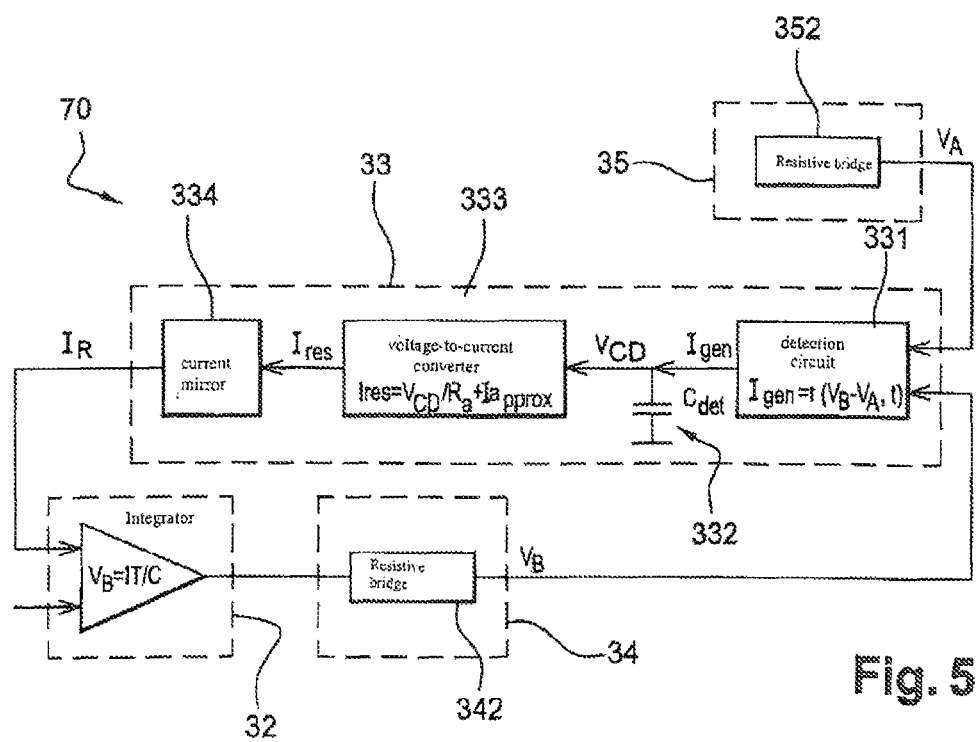
FIG. 5 is a diagrammatic view of a loop for controlling the slope of the continuous voltage ramp used to determine the low-order bits of the device in FIG. 1.

In FIG. 5 a voltage ramp slope control loop 70 is shown as used for the determination of the low-order bits. This loop 70 includes the circuit 33, the integrator 32, and the resistive bridges 34 and 35.

To be more specific, as can be seen in FIG. 5, the circuit 33 is connected to a node of the resistive bridge 342 to receive the voltage $V_B$ therefrom, and to a set circuit delivering a voltage $V_A$ equal to the value required for the voltage $V_B$ at mid-slope during its decrease phase, i.e. the value of this voltage at the instant $$\frac{2^L \cdot T_c}{2}$$

after closing the contact breaker 323 of the reference generator 30.

The set circuit comprises to advantage the second resistive bridge 352. For example, the resistance of the bridge 352, corresponding to the resistance of the first resistive bridge 342 at the node of which the voltage $V_B$ is sampled, is formed of two resistances in series of value R/2 and the voltage $V_A$ is sampled at the intermediate node between these two resistances. Thus, when the voltages at the nodes of the first resistive bridge 342 are constant, i.e. when the contact breaker 221 is closed, the relation $$V_B - V_A = \frac{\Delta V_{ref}}{2}$$

is verified.

With reference again to FIG. 5, the current generator circuit 33 comprises:

a so-called "detection" circuit 331, receiving the voltages $V_A$ and $V_B$ and producing a current $I_{gen}$ dependent on the difference in voltages $V_B - V_A$ and with the same sign;

a capacitor 332, connected to the detection circuit 331 and integrating the current $I_{gen}$ produced thereby;

a current source 333 connected to the terminals of the capacitor 332, and producing a current $I_{res}$ equal to the sum of a first current $I_{approx}$ and a second current $I_{corr}$ proportionate to the voltage $V_{CD}$ at the terminals of the capacitor 332. To be more specific, the current source 333 comprises a sample/hold (not shown) which samples and stores the voltage $V_{CD}$ on command, and produces a current $I_{res} = I_{approx} + \alpha \cdot V_{CD}^{ech}$, where $V_{CD}^{ech}$ is the sampled and stored value of the voltage $V_{CD}$ and $\alpha$ is a predetermined positive coefficient; and a current mirror copying the output current $I_{res}$ of the circuit 33, the copy of the current $I_{res}$ constituting the current $I_R$.

The current $I_{approx}$ is an approximate current corresponding to a pre-setting of the current $I_R$ to a value close to, or equal to, $$\frac{C \cdot \Delta Vref}{2^L \cdot T_c}$$

and the current $I_{corr}$ is a current for the correction of the current $I_{approx}$ so as to obtain the required slope.

Figure 6:
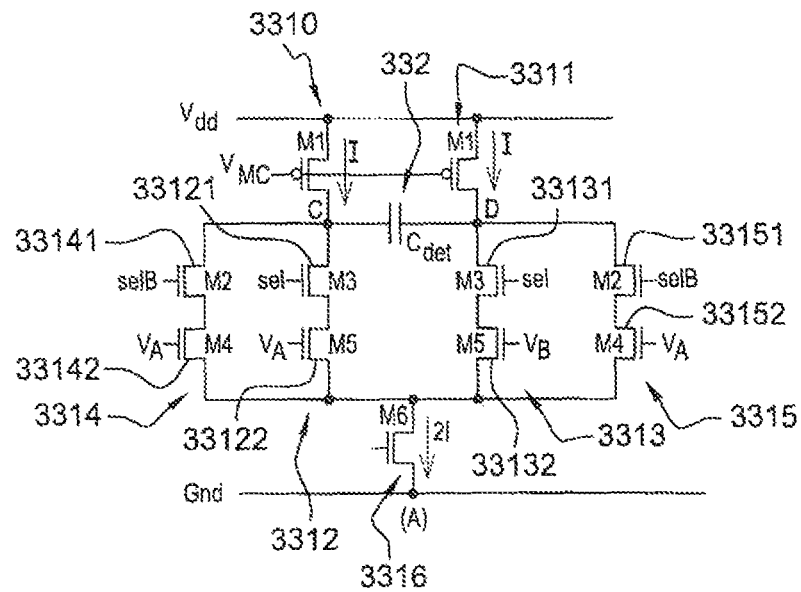
FIG. 6 is a diagrammatic view of the circuit for setting a current used to generate the slope of a continuous voltage ramp and forming a constituent part of the control loop in FIG. 4.

FIG. 6 is a diagrammatic view of the detection circuit 331. The detection circuit comprises to advantage a differential amplifier to the nodes C and D of which is connected the capacitor 332, and comprises:

two field-effect transistors 3310, 3311 whereof the sources are connected to a voltage $V_{DD}$ and which are connected by their gates to a common mode inverse feedback circuit (not shown) delivering a control voltage $V_{MC}$. The transistors 3310 and 3311 thus deliver the same constant current I;

two internal branches 3312, 3313 connected to the transistors 3310, 3311 respectively. Each of these branches comprises a first switch-forming field-effect transistor 33121, 33131, controlled by a selection signal sel and connected by its drain to the drain of the transistor 3310, 3311, and a second field-effect control transistor 33122, 33132 connected by its drain to the source of the switch-forming transistor 33121, 33131. The switch-forming transistors, 33121, 33131, receive at their gate a selection signal sel. The control transistor 33122 of one of the internal branches 3312 receives the voltage $V_A$ while the control transistor 33132 of the other branch 3313 receives the voltage $V_B$;

two external branches 3314, 3315 connected to the transistors 3310, 3311 respectively. Each of these branches comprises a first switch-forming field-effect transistor 33141, 33151, connected by its drain to the drain of the transistor 3310, 3311, and a second field-effect control transistor 33142, 33152 connected by its drain to the source of the switch-forming transistor 33141, 33151. The switch-forming transistors 33141, 33151, receive at their gate a selection signal $selB=\overline{sel}$ which is the complement of the selection signal sel. The switch-forming transistors of the external branches are therefore controlled in opposition to the switch-forming transistors of the internal branches. The control transistors 33142, 33152 receive for their part at their gate the voltage $V_A$; and a field-effect transistor 3316, whereof the drain is connected between the sources of the control transistors 33122, 33132, 33142, 33152 and whereof the source is grounded. The transistor 3316 thereby operates as a fixed current source of value 2·I.

The control transistors 33122, 33132 are polarized so that they operate permanently in on mode, i.e. with a gate-to-source voltage $V_{GS}$ substantially above their threshold voltage $V_t$ so that the variations in the differential input $V_B-V_A$ are correctly conveyed by a differential current $I_{gen}$, as is set out in more detail below.

Ramp slope regulation comprises alternating first phases, during which the contact breaker 323 is closed (known as "phases 1" as shown in FIG. 9 which shows the change in the voltages $V_A$ and $V_B$ over time), and second phases during which the contact breaker 323 is open for the period of time $2^L \cdot T_C$ (known as "phase 2" as shown in FIG. 9).

To advantage, the ramp is regulated during the digitization of the voltages. The selection signal sel is thus equal to the signal for controlling the contact breaker 323 and the signal selB is equal to the complement thereof. The timing diagram of the selection signal sel is given in FIG. 10.

Figure 7:
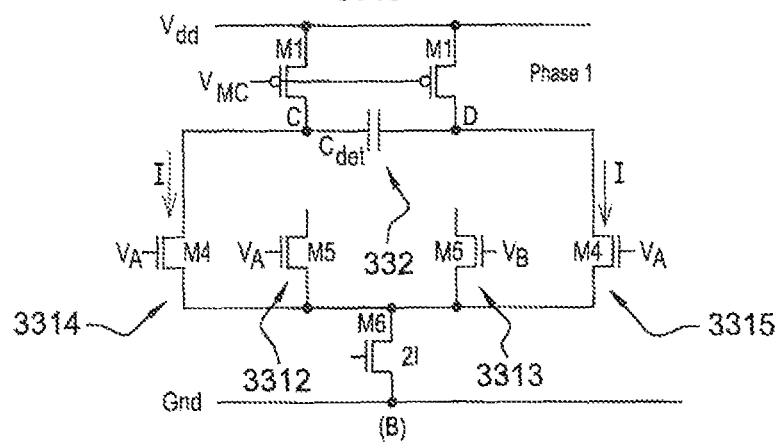
FIGS. 7 and 8 are diagrammatic views of this same circuit wherein are shown the currents flowing in its components during the different ramp slope control phases.

During a first phase, the signal sel is set to the low state and the signal selB is therefore set to the high state. The switch-forming transistors 33121, 33131 of the internal branches 3312, 3313 are then in their off state, and the switch-forming transistors 33141, 33151 of the external branches 3312, 3313 are in their on state, as is shown in FIG. 7 which shows the state of said transistors via an open circuit or via a short circuit. Since the control transistors 33142, 33152 of the external branches receive at their gate the same voltage $V_A$, they are therefore balanced, so that the same current I passes through them. As a result, no current flows towards the capacitor 332 which thereby preserves a constant voltage $V_{CD}$ at its terminals.

During this same first phase, the voltage $V_{CD}$ is sampled and stored in the sample/hold of the current source 333 so that the current generator circuit 33 produces a constant current $I_R = I_{approx} + \alpha \cdot V_{CD}^{ech}$ throughout the second phase which follows.

Figure 8:
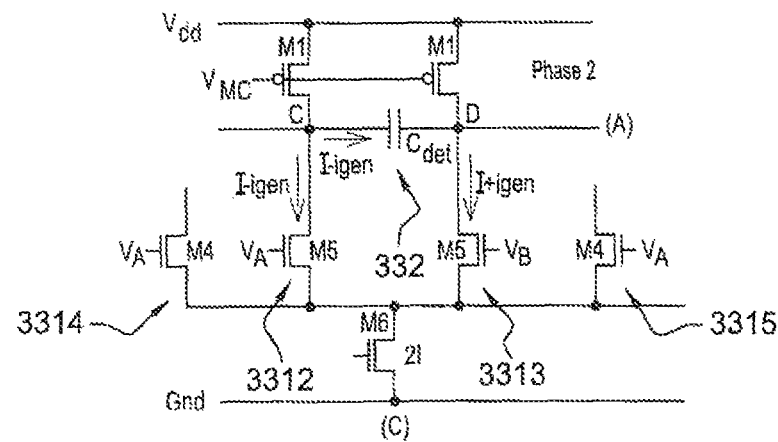

During this second phase, the signal sel is set to the high state and the signal selB is therefore set to the low state. The switch-forming transistors 33121, 33131 of the internal branches 3312, 3313 are then in their on state, and the switch-forming transistors 33141, 33151 of the external branches 3312, 3313 are in their off state, as is shown in FIG. 8 which shows the state of said transistors via an open circuit or via a short circuit.

Furthermore, during this second phase, the contact breaker 323 is open so that the integrator 32 integrates the current $I_R = I_{approx} + \alpha \cdot V_{CD}^{ech}$ and imposes a voltage ramp at the injection node of the resistive bridge 342. The voltage $V_B$ therefore follows said ramp, as is shown in FIG. 9 by the decreasing portions thereof.

Furthermore, since the control transistors 33122, 33132 of the internal branches 3312, 3313 receive at their gate different voltages $V_A$ and $V_B$ respectively, these branches are therefore unbalanced. There thus flows in the internal branch 3312 controlled by the voltage $V_A$ a current $$I - \frac{I_{gen}}{2},$$

and in the external branch 3313 controlled by the voltage $V_B$ a current $$I + \frac{I_{gen}}{2}.$$

It is shown (see for example "P. Gray and R. Meyer: Analysis and design of analog integrated circuits" J. Wiley & Sons, 4th Revised edition (9 Apr. 2001) §3, P220) that in the appropriate polarization conditions previously indicated, the differential current is expressed by the relation:

$$\frac{I_{gen}}{2} = k \frac{W}{4L}(V_B - V_A) \sqrt{\frac{8I}{k\frac{W}{L}} - (V_B - V_A)^2}$$

where W and L are the dimensions of the gate of the control MOS 33122, 33132, and k a proportionality factor.

In practice, the differential pair supplies a linear current $I_{gen}$ relative to the input signal when the relation $\sqrt{2}(V_{GS}-V_t) > (V_B-V_A)_{max}$ is satisfied, where $(V_{GS}-V_t)$ is the margin of polarization in on mode of the control MOS 33122 and 33132 beyond their threshold voltage $V_t$. Put another way, the differential pair is correctly polarized when the relation $$(V_{GS} - V_t) > \frac{\Delta V_{ref}}{2\sqrt{2}}$$

is satisfied.

However, it will be noted that the linearity so obtained is not necessary to the operation of the differential pair in the context of the invention. Indeed, the straightforward effect of a non-linearity is a variation in the charge gain of the capacitance $C_{det}$ as a function of the signal $(V_B-V_A)$. However, even in the presence of such a variation, the balance point of the inverse feedback loop remains unchanged, and consequently the final balance value of the charge in the capacitor 332.

Thus in the context of the invention, the term "dependent" signifies the relation between $I_{gen}$ and the differential signal ($V_B$–$V_A$), this dependence being able to be proportionate if the detection circuit 331 operates in linear conditions.

There therefore flows in the capacitor 332 a current $I_{gen}$ of sign equal to the sign of the voltage difference $V_B$–$V_A$. This current $I_{gen}$ is thus integrated in the capacitor 332 during the entire period of time $2^L \cdot T_C$ that the second phase lasts.

In particular when this difference is positive, the voltage $V_{CD}$ at the terminals of the capacitor 332 increases. Conversely, when the difference $V_B$–$V_A$ is negative, the voltage $V_{CD}$ at the terminals of the capacitor 332 decreases. Thus, at the end of the second phase, if the difference $V_B$–$V_A$ is positive for longer than it is negative, the voltage $V_{CD}$ will have increased, and vice versa.

On the other hand, if the difference $V_B$–$V_A$ is positive for as long as it is negative, the voltage $V_{CD}$ keeps the same value at the end of the second phase. As the voltage $V_A$ is chosen to be equal to the required value for the voltage $V_B$ at mid-slope, this means that the voltage $V_B$ has exactly decreased by the increment $\Delta V_{ref}$ over the period of time $2^L \cdot T_C$. As a result, the current $I_R$ is set to the value that allows this required decrease to be obtained.

To advantage, the coefficient $\alpha$, used by the current source 333 to produce the current $I_{res}=I_{approx}+\alpha \cdot V_{CD}^{ech}$, is adjusted so as to obtain an inverse feedback gain on the value of the ramp current $I_R$ supplied by the generator circuit 33 in accordance with good practice in relation to stable and low error regulators.

In fact a plurality of cycles of first phases and second phases are necessary to set the current $I_R$, as is shown in FIGS. 11 and 12. It will be noted in this respect that the capacitor 332 is never discharged to allow a modification in the voltage $V_{CD}$ from one cycle to the other, and thereby stabilize this voltage and so set the current $I_R$.

FIG. 11 shows the change over time in the voltages $V_C$ and $V_D$ at the two terminals of the capacitor 332 and FIG. 12, the change over time in the term $V_{CD}^{ech}$.

As can be seen in FIG. 9, the initial value of the current $I_R$ is too low and does not allow a sufficient decrease in the voltage $V_B$ (the decrease $\Delta V_R$ in the first second phase is less than the increment $\Delta V_{ref}$). At the end of two complete cycles of first and second phases, the voltage $V_{CD}$ no longer varies, as can be seen in FIG. 11, just like the term $V_{CD}^{ech}$, as can be seen in FIG. 12.

Thus, whatever the initial slope error relative to the required ideal slope, a steady-state is obtained in a few cycles through natural convergence of the voltage generation circuit 33 towards said ideal slope, due to the segmented cycle-to-cycle inverse feedback implemented thereby. Said steady-state corresponds to the stable asymptotic value of the differential voltage $V_{CD}$ sampled at the terminals of the capacitor 332. This voltage thus forms an "error signal" which corresponds to the particular value imposing through the voltage source 333 the particular ramp current $I_R$ value that produces the balance of the charge and discharge times of the capacitor 332, over the period of time $2^L \cdot T_C$ of the ramp.

Thus, the second phase ramp produced in balance by the integrator 32 by integrating the current $I_R$ supplied by the circuit 33 produces a voltage $V_B$ route from $V_A+\Delta V_{ref}/2$ to $V_A-\Delta V_{ref}/2$. The same is true for all the other reference voltages extracted from the nodes other than that of the point voltage $V_B$. In other words, the total ramp voltage deviation is equal to $\Delta V_{ref}$, i.e. a high-order digitization increment, over the time space allocated to the second phase, i.e. by definition $2^L \cdot T_C$. This is the required result to ensure the accuracy of the low-order digitization.

In practice, a convergence time of a few milliseconds is easily achievable, perfectly compatible with the requirements of most applications, and in particular in imaging.

FIG. 13 is a diagrammatic view of a preferred embodiment of the current source 333.

In this embodiment, the current source 333 comprises two branches 3331 and 3332 between a voltage $V_{DD}$ and the ground. Each of these branches comprises a p-channel field-effect transistor 33311, 33321, whereof the source is connected to the voltage $V_{DD}$ and whereof the gate is connected to its drain, an n-channel field-effect transistor 33312, 33322, whereof the drain is connected to the drain of the transistor 33311, 33321 and a constant current source 33313, 33323 connected between the source of the transistor 33312, 33322 and the ground. These current sources are dimensioned and polarized so as to supply the current $I_{approx}$.

The current source 333 also includes a resistance 3333 connected between the sources of the transistors 33312, 33322 and of value Ra=1/α.

The voltage difference $V_{CD}$ is applied between the gates of the transistors 33312, 33322.

The gates of the transistors 33321 of the current source 333 and of the transistor constituting the current mirror 334 are connected to one armature of a hold capacitor, the other armature thereof being connected to a fixed potential. Said gates are connected to each other by a contact breaker 3334 controlled by the signal "sel" arranged upstream of said capacitor. This arrangement constitutes a sample/hold of the control voltage of the mirror, in other words of the current $I_{res}$, in an alternative and equivalent manner to the upstream sampling of the voltage $V_{CD}$ to form the voltage $V_{CD}^{ech}$ proposed above in the interests of clarity of disclosure. According to this circuit shape, the voltage $V_{CD}$ is not sampled.

This current source 333, which therefore operates as a voltage-to-current converter, has the advantage of having a very strong input impedance which makes it possible not to degrade the voltage $V_{CD}$ at the terminals of the capacitor 332. Preferably, the value Ra of the resistance 3333 is sufficiently high considering the impedance of the transistors 33312, 33322 and of the current sources 33313 and 33323, without however producing too low a value for the inverse feedback loop gain. In practice, this compromise does not pose any difficulty, and a sampled copy of the current $I_{res}=I_{approx}+\alpha V_{CD}$ is obtained in the mirror 334.

Without however departing from the spirit of the invention it is possible to favor one feature of the converter over another, or more generally, to find an optimum compromise between the different characteristics. For example, it is possible to optimize the digitization noise by implementing a "degeneracy" (putting a resistance in series with the current source 341) of the mirror connected to the circuit 34. This advantage is obtained to the detriment of converter speed, since the degeneracy reduces the current $I_{ref}$ that can be injected into the resistive bridge 342. It is also possible to adjust the accessible ramp current range by adapting the resistance Ra. This adjustment is to be undertaken in relation to the accessible voltage range $V_C$–$V_D$, and with regard to the overall inverse feedback loop gain, which is proportionate to $1/(Ra \cdot C_{det})$.

It is clear that the internal looping of the reference generator 30 provides the temporal connection of the reference voltages between the different digitization phases, whatever the variations in temperature of the converter, and even the technological variations from one converter to the other. As soon as the precision of distribution of the resistances according to the circuits 34 and 35 and the identity of the copies of the charge current $I_{ref}$ are adequate relative to targeted converter performance, the operational precision of the converter is maintained automatically whatever the operating temperature. Likewise, there is no need to design with a great precision (apart from identifying the resistances required to form the reference nodes of the resistive bridges 342 and 352) the physical constituents of the converter of the invention as regards the features related to technological dispersions.

The invention claimed is:

1. An analog-to-digital conversion device for receiving voltages for conversion on parallel inputs with which it is provided, said device including:
a single reference voltage generation circuit for the generation of reference voltages that are constant and then decreasing over time, according to discrete values, said voltage generation circuit including:
a current source configured to generate a first constant current;
a first resistive bridge formed of resistances in series and connected to the constant current source, the voltages at the nodes of the first resistive bridge forming the reference voltages;
a voltage source configured to produce a decreasing voltage on an injection node of the first resistive bridge;
a contact breaker for controlling the connection of the voltage source to the injection node of the first resistive bridge,
said voltage generation circuit configured to generate reference voltages that are constant and then decreasing over time, according to discrete values; and
a digitization circuit connected to each parallel input of the device, said circuit being connected to the reference voltage generation circuit and including:
means for comparing the voltage for conversion received on one of the parallel inputs of the device with the reference voltages;
means for selecting the reference voltage whereof the value, when said reference voltage is constant, is immediately higher than the voltage for conversion;
means for counting a number of time units necessary for the reference voltage selected to become lower than the voltage for conversion when said reference voltage is decreased; and
means for storing on the one hand, a reference associated with the constant reference voltage which is immediately lower than or equal to the voltage for conversion, and on the other hand, the number of counted time units, the high-order bits of the digital value of the voltage for conversion corresponding to said reference, and the low-order bits of said digital value corresponding to the number of counted time units.

2. The analog-to-digital conversion device as claimed in claim 1, wherein the reference voltage generation circuit is configured to deliver reference voltages evenly spaced apart according to a predetermined pitch, constant over time or decreasing along a single voltage ramp of predetermined slope.

3. The analog-to-digital conversion device as claimed in claim 2, wherein the reference voltage generation circuit is configured to deliver $2^H$ reference voltages evenly spaced apart by a predetermined pitch and to make these reference voltages decrease by the predetermined pitch over a period of time equal to $2^L \cdot T_C$, where H is the number of high-order bits, L is the number of low-order bits and $T_C$ is the value of the time unit.

4. The analog-to-digital conversion device as claimed in claim 1, wherein the voltage generation circuit comprises:
a voltage circuit configured to produce a voltage substantially identical to that of the injection node of the first bridge in the absence of connection between the decreasing voltage source and the reference node of the first resistive bridge;
a current generator circuit;
an operational amplifier:
mounted in inverse feedback on its inverting input via a capacitor,
whereof the inverting input is connected to the current generator circuit,
whereof the non-inverting input is connected to the voltage circuit,
and whereof the output is connected to the injection node of the first resistive bridge;
and wherein a controllable contact breaker is mounted in inverse feedback on the inverting input of the operational amplifier.

5. The analog-to-digital conversion device as claimed in claim 4, wherein the current generator circuit comprises:
a detection circuit configured to measure the difference between the voltage of a node of the first resistive bridge and an expected value for this voltage at mid-slope, and of producing a current proportionate to said difference;
a capacitor connected to the measurement circuit and configured to integrate the current delivered thereby; and
a current source forming the current delivered by the current generator as a function of the voltage at the terminals of the capacitor.

6. The analog-to-digital conversion device as claimed in claim 1, wherein the digitization circuit further comprises a sequential selection circuit connected to the reference voltage generation circuit so as to receive the reference voltages therefrom on parallel inputs, said selection circuit being configured to select the reference voltages sequentially according to their decreasing values and of delivering the voltages selected to the comparison means.

7. The analog-to-digital conversion device as claimed in claim 6, wherein the comparison means include a comparator connected to the parallel inputs of the device and to the output of the sequential selection circuit, and wherein the storage means include a memory controlled by the output of the comparator and storing the address of the parallel input of the sequential selection circuit in process of selection when the comparator output flips.

8. The analog-to-digital conversion device as claimed in claim 7, wherein:
the reference voltage generation circuit is configured to generate an additional voltage higher than the reference voltages, and comprises a controllable switch configured to select, and deliver to the sequential selection circuit, the lowest voltages of the set formed by the reference voltages and the additional voltage or the highest voltages of said set;
control means for flipping the switch into its mode for the selection of the highest voltages when the comparator flips; and
means for blocking the sequential selection circuit on the input whereof the voltage flips the comparator.

9. The analog-to-digital conversion device as claimed in claim 7, including means for blocking the sequential selection circuit on the input corresponding to the voltage immediately higher than the one that flips the comparator.

10. The analog-to-digital conversion device as claimed in claim 4, wherein the current generator comprises:
- a detection circuit configured to measure the difference between the voltage of a node of the first resistive bridge and an expected value for this voltage at mid-slope, and of producing a current proportionate to said difference;
- a capacitor connected to the measurement circuit and configured to integrate the current delivered thereby; and
- a current source forming the current delivered by the current generator as a function of the voltage at the terminals of the capacitor.

11. An electromagnetic radiation matrix detector including:
- a matrix of photo-detectors, each of the photo-detectors configured to vary an electric variable as a function of the radiation incident thereon;
- electronics electrically coupled to said matrix of photo-detectors so as to address said matrix line by line, and forming electric voltages relative to the photosensitive elements of the addressed line, and of delivering said voltages to parallel outputs; and
- an analog-to-digital conversion device electrically coupled to said electronics and configured to digitize the electric voltages delivered to the parallel outputs of the read circuit in accordance with any one of the previous claims, a digitizer circuit being connected to each output of the read electronics.

\* \* \* \* \*